(12) United States Patent
Kanechika et al.

(10) Patent No.: US 7,319,080 B2
(45) Date of Patent: Jan. 15, 2008

(54) ALUMINUM NITRIDE SINTERED COMPACT

(75) Inventors: Yukihiro Kanechika, Shunan (JP); Toshikatsu Miki, Ube (JP); Ayako Kai, Yamaguchi-ken (JP)

(73) Assignee: Tokuyama Corporation, Shunan-shi (JP)

( * ) Notice: Subject to any disclaimer, the term of this patent is extended or adjusted under 35 U.S.C. 154(b) by 95 days.

(21) Appl. No.: 10/528,248

(22) PCT Filed: Sep. 17, 2003

(86) PCT No.: PCT/JP03/11832

§ 371 (c)(1),
(2), (4) Date: Nov. 14, 2005

(87) PCT Pub. No.: WO2004/026790

PCT Pub. Date: Apr. 1, 2004

(65) Prior Publication Data

US 2006/0154827 A1    Jul. 13, 2006

(30) Foreign Application Priority Data

Sep. 20, 2002  (JP) .............................. 2002-275604

(51) Int. Cl.
*C04B 35/581* (2006.01)
(52) U.S. Cl. ..................................... 501/98.4; 501/98.5
(58) Field of Classification Search ............... 501/98.4, 501/98.5
See application file for complete search history.

(56) References Cited

U.S. PATENT DOCUMENTS 6,294,275 B1 * 9/2001 Natsuhara et al. .......... 428/698
6,800,576 B2 * 10/2004 Katsuda et al. ............ 501/98.4

FOREIGN PATENT DOCUMENTS

| JP | 02172869 A | 7/1990 |
| JP | 3-56604 A | 3/1991 |
| JP | 5-238830 | * 9/1993 |
| JP | 2000-128648 A | 5/2000 |
| JP | 2000128648 A | 5/2000 |
| JP | 2000-327430 A | 11/2000 |
| JP | 2001-220247 A | 8/2001 |
| JP | 2002-274949 A | 9/2002 |

* cited by examiner

*Primary Examiner*—Karl E Group
(74) *Attorney, Agent, or Firm*—Birch, Stewart, Kolasch & Birch, LLP

(57) ABSTRACT

An aluminum nitride sintered body comprising crystal grains of an average grain size ($D_{50}$) of 0.1 to 2.5 μm, and having a pore area ratio of not larger than $1\times10^{-7}$, a pore density of not larger than 0.05 pores/mm² of pores having diameters of not smaller than 1 μm, and a Vickers' hardness in a range of 14 to 17 GPa. The aluminum nitride sintered body has a very small pore density despite of its relatively small crystal grain size, features excellent strength and mirror machinability, and is particularly useful as a material for circuit substrates on which fine wiring patterns are formed.

3 Claims, 1 Drawing Sheet

ALUMINUM NITRIDE SINTERED COMPACT

BACKGROUND OF THE INVENTION

1. Field of the Invention

The present invention relates to a novel aluminum nitride sintered body and a method of producing the same. More specifically, the invention relates to an aluminum nitride sintered body comprising crystal grains of relatively small grain sizes, containing pores in very small amounts, suited particularly as a substrate to be mirror polishing and having a large strength.

2. Description of the Related Art

Owing to their excellent thermal conducting properties, insulating property and free of toxicity, aluminum nitride sintered bodies have been put into practical use as various substrate materials having heat-radiating function.

The aluminum nitride sintered bodies have heretofore been produced on an industrial scale by sintering an aluminum nitride powder to which a sintering aid is added at a temperature of as high as 1700° C. or higher (hereinafter referred to as resistance heating sintering method).

The resistance heating sintering method is the one by which the sintering is effected over extended periods of time during which crystal grains of aluminum nitride grow to constitute the sintered body. Therefore, the sintered body obtained by the above method has a relatively large crystal grain size. Further, a gas entrapped in the starting aluminum nitride powder grows together with the growth of crystal grains developing a phenomenon of forming relatively large pores.

Therefore, when it is attempted to machine the surface of the sintered body obtained by the above resistance heating sintering method like a mirror surface to use it as a substrate for a circuit, large grain size and the presence of pores make it difficult to form highly fine wiring patterns. Besides, the sintered body has a small strength due, presumably, to the crystal grain size and the presence of pores leaving room for improvement even from the standpoint of strength.

In producing a ceramic sintered body, on the other hand, there has been known a method of decreasing the crystal grain size of the obtained sintered body by exposing the aluminum nitride powder to which a sintering aid is added into a plasma (patent document 1: JP-A-2-172869).

The above method may make it possible to obtain a sintered body having small crystal grain sizes. In conducting the sintering, however, infiltration of a plasma gas into the interior is an essential requirement. Besides, the sintering completes in short periods of time and, hence, the gas tends to be trapped in the sintered body. As a result, though the method of the patent document 1 makes it possible to achieve a sintering density which is high to some extent, pores unavoidably remain in the sintered body. Presence of pores makes it difficult to use the sintered body as a substrate for circuits that require the formation of highly fine wiring patterns. Besides, this method requires a facility of a large scale for generating and sustaining a plasma, involving a problem in that it is not easy to put the method into practice on an industrial scale.

In recent years, on the other hand, there has been proposed a method of producing a ceramic sintered body by utilizing a so-called "discharge plasma" by feeding a pulse current while pressing a ceramic powder. Concretely speaking, there has been proposed a method of sintering the ceramic powder in a mold by the action of a plasma that is presumed to take place in the ceramic powder by filling the molding die with the ceramic powder under a pressurized state between the electrodes and by heating the molding die by feeding a pulse current (patent document 2: JP-A-2000-128648).

The above sintering method utilizing the discharge plasma is conducted by using a simple facility while elevating the temperature by heating the molding die. Therefore, the temperature can be easily controlled and, hence, attention has been given to this sintering technology as a future technology. According to this method, further, the ceramic powder is heated to a sintering temperature within a short period of time, the grains are suppressed from growing during the sintering, and it is expected that there can be obtained a sintered body having a mechanical strength greater than that obtained by the conventional resistance heating sintering method.

However, when the above discharge plasma is applied to sintering the aluminum nitride powder, it was found that pores are formed in large amounts though the sizes thereof are smaller than those formed by the resistance heating sintering method. That is, the patent document 2 discloses a method of producing a ceramic sintered body by densely compressing the ceramic powder by the pre-treatment such as hydrostatic pressure treatment and, then, elevating the temperature to 300 to 1500° C. by feeding a pulse current. However, the present inventors have confirmed that it is difficult to effectively prevent the formation of pores in the sintered body despite the aluminum nitride powder is pressed to possess a sufficiently increased density. Therefore, it is difficult to form a mirror surface having a high degree of smoothness on the aluminum nitride sintered body obtained by this method.

SUMMARY OF THE INVENTION

It is therefore an object of the present invention to provide an aluminum nitride sintered body comprising crystal grains of small grain sizes, containing pores therein in very decreased amounts and having a large strength and a highly heat conductivity, and a method of producing the same.

In order to achieve the above object, the present inventors have conducted keen study and have discovered the fact that when a temperature that is reached when the aluminum nitride powder is treated by feeding a pulse current is set to a value which is as high as that the aluminum nitride crystal grains do not grow to a conspicuous degree, the bubbles in the powder are removed at an increased efficiency during the sintering and there is obtained an aluminum nitride sintered body having a very decreased pore density. It was further discovered that the aluminum nitride sintered body obtained by sintering by feeding the pulse current exhibits a very increased hardness owing to its mode of sintering and a high temperature that is reached, and features a high hardness that could not be achieved with the conventional aluminum nitride sintered bodies.

According to the present invention, there is provided an aluminum nitride sintered body comprising crystal grains of an average grain size ($D_{50}$) of 0.1 to 2.5 μm, and having a pore area ratio of not larger than $1 \times 10^{-7}$, a pore density of not larger than 0.05 pores/mm² of pores having diameters of not smaller than 1 μm, and a Vickers' hardness in a range of 14 to 17 GPa.

According to the present invention, there is further provided a method of producing an aluminum nitride sintered body by sintering an aluminum nitride powder by feeding a pulse current, wherein the pulse current is so fed while pressing the aluminum nitride powder that the temperature that is reached is higher than 1500° C. but is not higher than 1800° C.

According to the present invention, further, there is provided a substrate for a circuit (circuit-substrate) obtained by mirror polishing the aluminum nitride sintered body.

The aluminum nitride sintered body of the invention comprises crystal grains of small grain sizes, contains large pores of not smaller than 1 μm in very small amounts, and can be excellently mirror polished. Through the mirror polishing, therefore, the aluminum nitride sintered body of the invention forms a mirror surface featuring excellent smoothness. Therefore, the aluminum nitride sintered body of the invention is very useful as a circuit substrate on which fine circuit patterns are formed, and offers a very high industrial value.

Moreover, the aluminum nitride sintered body of the invention has such characteristics as a very high surface hardness, and can be easily handled in the applications of the substrate material and is, further, useful in other applications as a slide member that requires heat conducting property.

According to the method of producing an aluminum nitride sintered body of the present invention, further, there can be obtained an aluminum nitride sintered body having a high surface hardness featuring an ultra-fine texture, a sharp crystal grain size distribution of the sintered body, a low pore density and a high surface hardness without producing a compressed powder by CIP or without conducting any preceding step such as a step of ultra-finely milling the powder.

Figure 1:
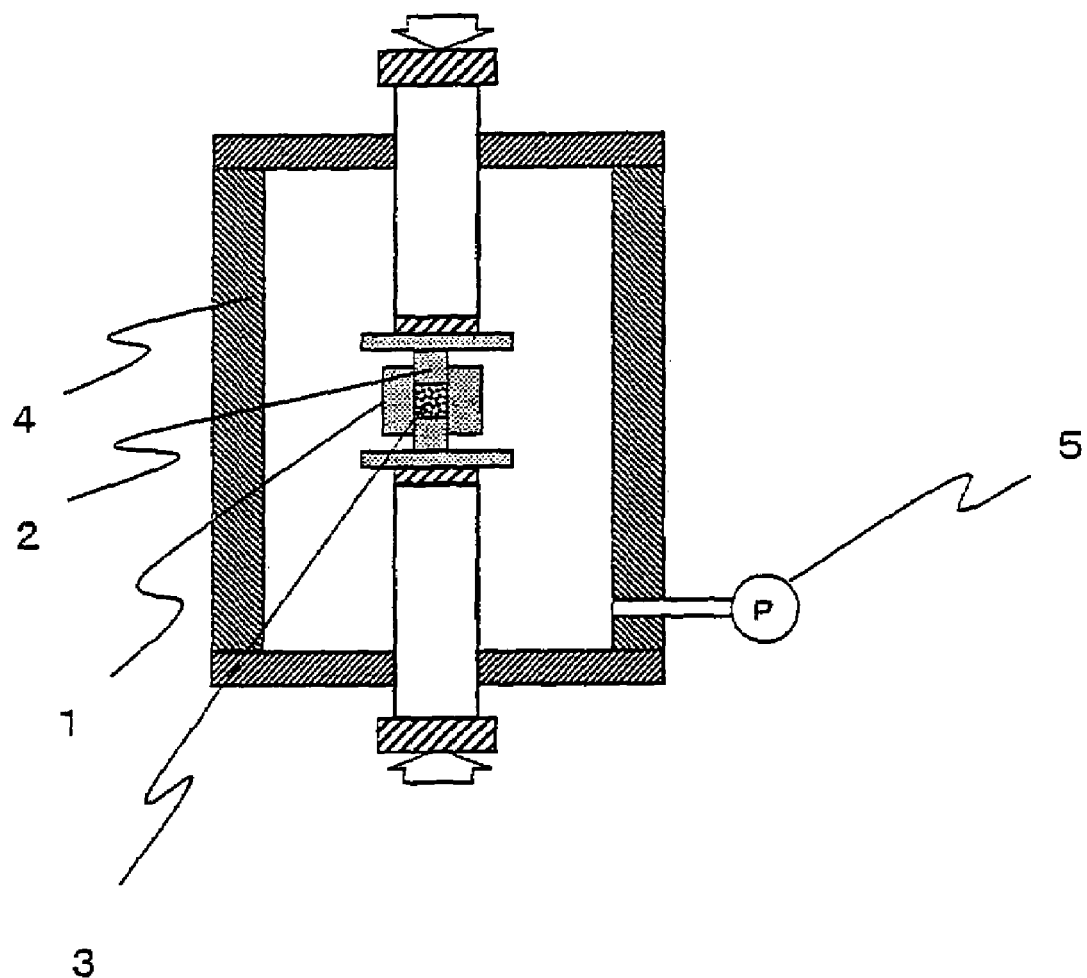
FIG. 1 is a view schematically illustrating a basic structure of an apparatus used in the production method of the present invention.

DETAILED DESCRIPTION OF THE INVENTION (Aluminum Nitride Sintered Body)

An aluminum nitride sintered body of the present invention features small crystal grain sizes and contains large pores of not smaller than 1 μm in very small amounts. When the surface is mirror polished, therefore, the aluminum nitride sintered body of the invention realizes an "ultra" mirror surface having excellent smoothness that could not be seen with the conventional aluminum nitride sintered bodies.

Namely, the aluminum nitride sintered body of the present invention has an average crystal grain size ($D_{50}$) in a range of 0.1 to 2.5 μm, a pore area ratio of as very small as $1 \times 10^{-7}$ or smaller (ideally, the pore area ratio of substantially zero), and a pore density of as very small as 0.05 pores/mm$^2$ or smaller (ideally, the pore density of substantially zero) of pores of diameters of not smaller than 1 μm.

In the present invention, the average crystal grain size, the pore area ratio and the density of pores of diameters of not smaller than 1 μm of the aluminum nitride sintered body assume values as described below.

(1) Average Crystal Grain Size (μm): $D_{50}$

A cumulative 50% diameter ($D_{50}$) on a grain size distribution curve corresponding to circles of crystal grains found on a mirror polished surface on any cut surface of the aluminum nitride sintered body.

(2) Pore Density (pores/mm$^2$)

A value representing the number of pores per a unit area on a surface obtained by mirror polishing any cut surface of the aluminum nitride sintered body.

(3) Pore Area Ratio

A value obtained from the total area of the pores calculated from the diameters (not smaller than 1 μm) of pores existing in a visual field of a predetermined area on the mirror polished surface of the aluminum nitride sintered body, which is divided by the total visual field area that is observed.

Details of the measuring methods are described in Examples.

If it is attempted to obtain the aluminum nitride sintered body of the invention having an average crystal grain size of smaller than 0.1 μm, the aluminum nitride powder in the stage of the starting material undergoes the oxidation to a conspicuous degree and, as a result, the obtained aluminum nitride sintered body exhibits a decreased thermal conductivity. The aluminum nitride sintered body having an average crystal grain size in excess of 2.5 μm, on the other hand, exhibits a decreased strength.

When the aluminum nitride sintered body of the invention has a pore density of more than 0.05 pores/mm$^2$ of the pores of diameters of not smaller than 1 μm, the mirror machinability decreases due to the presence of pores, it becomes difficult to obtain a highly smooth mirror surface and, besides, the sintered body exhibits a decreased strength.

Further, when the aluminum nitride sintered body of the invention has a pore area ratio of higher than $1 \times 10^{-7}$, the mirror machinability decreases and the strength decreases due to the presence of pores even when the pore density is small.

The aluminum nitride sintered body obtained by the conventional resistance heating sintering method permits grains to grow conspicuously even by using an aluminum nitride powder of small grain sizes as a starting material. As a result, the crystal grain size exceeds 2.5 μm and often exceeds 5 μm depending upon the cases. Even when the pore density is small, the diameter of the pores increases as the crystal grains grow and the pore area ratio, usually, exceeds $5 \times 10^{-7}$ on the cut surface of the aluminum nitride sintered body. It will therefore be understood that the aluminum nitride sintered body of the invention having a small crystal grain diameter and containing pores in small amounts cannot be obtained by the conventional resistance heating sintering method.

Further, the aluminum nitride sintered body of the present invention features a very high hardness compared to that of the aluminum nitride sintered bodies obtained by the conventional resistance heating sintering method. Namely, the aluminum nitride sintered body of the invention exhibits a Vickers' hardness of 14 to 17 GPa and, particularly, 14.5 to 16.5 GPa. This value is 1.4 times as great as the Vickers' hardness of the above conventional aluminum nitride sintered body.

Though the mechanism that makes the aluminum nitride sintered body of the invention to contain pores in small amounts and to exhibit a high hardness as described above, is not clear yet, it is presumed that crystal grains of the aluminum nitride grow to a suitable degree in a range where the crystal grain sizes are relatively small to form a very dense structure.

Further, the aluminum nitride sintered body of the present invention exhibits a large strength due to its smaller crystal grain size than that of the aluminum nitride sintered body obtained by the conventional resistance heating sintering method. For example, the aluminum nitride sintered body of the invention obtained by sintering by also using a sintering aid exhibits a flexural strength of not smaller than 500 MPa.

Moreover, the aluminum nitride sintered body of the present invention exhibits a thermal conductivity which is as high as 50 to 80 W/mK when it is obtained without using the sintering aid and which is as high as 100 W/mK when it is obtained by sintering by also using the sintering aid.

In the present invention, further, it is particularly desired that the crystal grains forming the sintered body has such a crystal grain size distribution that a difference between the cumulative 90% grain size and the cumulative 10% grain size is not larger than 1.5 μm from the standpoint of further improving the mirror machinability. In the production method of the present invention by utilizing the pulse current as will be described below later, the grains grow little during the sintering and, hence, the crystal grain size distribution of the aluminum nitride powder that is used is directly reflected. Upon adjusting the crystal grain size distribution of the aluminum nitride powder that is used to be the crystal grain size distribution of the above crystal grains, therefore, the crystal grain size distribution of the crystal grains can be easily adjusted to lie within the above range.

In addition to being constituted by the aluminum nitride alone, the aluminum nitride sintered body of the present invention may further contain a sintering aid that is used for lowering the melting point on the crystal grain surfaces as briefly described above. As the sintering aid, yttrium oxide ($Y_2O_3$) is most generally used. However, there can be used any other known sintering aids such as alkaline earth compounds like CaO and SrO or rare earth compounds such as $CeO_2$, $Ho_2O_3$, $Yb_2O_3$, $Gd_2O_3$, $Nb_2O_3$, $Sm_2O_3$ and $Dy_2O_3$ in a single kind or in combination.

Further, being produced by feeding the pulse current as will be described later, the aluminum nitride sintered body of the present invention permits the oxide layer on the surfaces of the aluminum nitride powder to be easily vaporized and dissociated; i.e., there is obtained a sintered body having a decreased oxygen concentration.

(Production of the Aluminum Nitride Sintered Body)

Described below is a method of producing the aluminum nitride sintered body of the present invention.

That is, according to the present invention, the aluminum nitride powder is sintered while being pressed by feeding a pulse current in a manner that the temperature thereof that is reached is higher than 1500° C. but is not higher than 1800° C. to produce the aluminum nitride sintered product having the above-mentioned properties.

The aluminum nitride powder that is preferably used has an average crystal gain size which is slightly smaller than the average crystal grain size of the above-mentioned sintered body. Concretely speaking, it is desired to use an aluminum nitride powder having an average crystal grain size in a range of 0.05 to 2 μm and, particularly, 0.1 to 1 μm. That is, when the average crystal grain diameter is smaller than 0.05 μm, the ratio of the oxide layer increases on the surfaces of the grains. When the average crystal grain size is not higher than 5 μm, on the other hand, the crystal grain size becomes very great, the strength is not obtained, and the pore density is not suppressed to a low level. Namely, it becomes difficult to obtain the aluminum nitride sintered body having excellent mirror machinability.

It is desired that the aluminum nitride powder has a purity of as high as not lower than 97% by weight and, particularly, not lower than 99% by weight. The aluminum nitride powder having such a high purity has been placed in the market and is easily available.

The above-mentioned sintering aid can be used being mixed into the above aluminum nitride powder. Use of the sintering aid is desirable from the standpoint of obtaining more enhanced effect of the heat treatment after the sintering that will be described later. The sintering aid is used desirably in an amount of from 0.1 to 10 parts by weight and, particularly, from 1 to 5 parts by weight per 100 parts by weight of the aluminum nitride powder.

According to the present invention, the aluminum nitride is sintered by feeding a pulse current while pressing the aluminum nitride powder (or a mixed powder of the AlN powder and the sintering aid). Namely, a pulse current is fed to feed pulse-like electric energy directly among the gaps of powdery grains, whereby high energy of a high-temperature plasma that generates instantaneously due to a spark discharge is effectively applied to the thermal diffusion/electric field diffusion to efficiently form local neck junctions among the grains prior to arriving at the thermal equilibrium state enabling the neck junctions to grow into stable bonds thereby to accomplish the sintering in short periods of time. According to this pulse current method (often called discharge plasma sintering method), a sintered body of a high density without pores can be obtained in short periods of time maintaining a high quality without permitting the crystal grains to grow excessively at low temperatures through up to high temperatures irrespective of the presence of the sintering aid that is used for lowering the melting point on the grain surfaces.

Since the pulse current is fed while applying a pressure, the aluminum nitride powder is charged into a die space between a molding die made of electrically conducting carbon and a pair of molding punches made of electrically conducting carbon inserted in the molding die from the upper and lower sides. While pressing the thus charged aluminum nitride powder by the molding punches from the upper and lower sides, a DC pulse current is fed through the molding punches.

The current density of the pulse current is, usually, from 150 to 500 A/cm$^2$ and, preferably, from 300 to 400 A/cm$^2$, and the pulse period is from 30 Hz to 30 kHz and, preferably, from about 100 Hz to about 10 kHz. Generally, further, a pulse ratio (OFF:ON) represented by a ratio of the current-interrupting time (OFF) to the current-feeding time (ON) is from about 1:1 to about 2:24 and, preferably, from about 1:6 to about 2:12, and the voltage is from 1 to 10 V and, preferably, from 2 to 6 V.

It is further desired that the pulse current is fed in vacuum or in an inert gas atmosphere. It is further allowable to conduct the auxiliary heating by separately feeding a current for heating the molding die while feeding the pulse current.

In feeding the pulse current, it is desired that the pressure for pressing the aluminum nitride powder is from 0.3 to 0.6 tf/cm$^2$ and, particularly, 0.35 to 0.45 tf/cm$^2$. When the pressure is smaller than 0.3 tf/cm$^2$, the aluminum nitride powder does not become dense. That is, the sintering density cannot be increased and, at the same time, the pore density and the pore area ratio tend to increase. When the pressure exceeds 0.6 tf/cm$^2$, on the other hand, the sintering takes place easily but the effect of increasing the density reaches a limit and, besides, the sintering jigs such as the molding die and the molding punches tend to be broken at an increased probability.

Further, it is very important that the temperature that is reached by feeding a pulse current is in a range of from higher than 1500° C. to not higher than 1800° C. and, preferably, from not lower than 1550° C. to not higher than 1800° C. That is, when the temperature that is reached is lower than 1500° C., the gas that is entrapped is not removed to a sufficient degree in the step of sintering. Therefore, the amount of pores does not decrease and both the pore density and the pore area ratio do not satisfy the ranges of the present invention as will be clear from Examples appearing later. Further, when the temperature that is reached exceeds 1800° C., the crystal grains grow conspicuously in the sintered body to decrease the mirror machinability and the strength.

The temperature that is reached represents a maximum temperature in establishing a discharge plasma by feeding a pulse current. At the temperature that is reached, feeding of the pulse current is continued or the auxiliary heating is continued to maintain the above temperature until the sintering is finished to thereby obtain the aluminum nitride sintered body having a small pore density and a small pore area ratio maintaining stability. Though there is no particular limitation, the time for maintaining the above temperature is, usually, from 1 to 30 minutes and, preferably, from 1 to 5 minutes. The temperature that is reached can be adjusted by adjusting the intensity of the pulse current, interval among the pulses and the intensity of the power source for auxiliary heating.

It is further desired that the temperature is reached at a temperature-elevating rate of 30 to 150° C./min. and, preferably, 50 to 100° C./min. When the temperature-elevating rate is slow, the temperature profile is lengthened. When the temperature-elevating rate is too fast, it becomes difficult to obtain a sintered body which is sufficiently dense.

In charging the aluminum nitride powder into the molding die in the above production method, it is desired to interpose a carbon sheet on the interface along which the aluminum nitride powder comes in contact with the apparatus to prevent the sintering between the sintered body that is obtained and the die.

The aluminum nitride sintered body thus obtained features excellent mirror machinability, is capable of forming a very smooth mirror surface (e.g., having a maximum surface roughness Rmax of 0.040 µm or smaller) through the mirror polishing, and exhibits an excellent strength. Here, however, the aluminum nitride sintered body tends to exhibit a slightly decreased heat conductivity due to small crystal grain sizes. According to the present invention, therefore, after the feeding of the pulse current has been discontinued, it is desired that the sintered body obtained through the above step of sintering is heat-treated at a temperature of 1550 to 1800° C. and, preferably, 1680 to 1780° C. Through the above heat treatment, the aluminum nitride sintered body exhibits a strikingly improved thermal conductivity without deteriorating the above-mentioned properties. When the heat-treating temperature is lower than 1550° C., the thermal conductivity is not improved to a sufficient degree. When the heat-treating temperature exceeds 1800° C. the crystal grains grow and the sintered body exhibits a decreased flexural strength.

Through the above heat treatment, the crystal grains continue to grow while the pore density and the pore area ratio of the sintered body remain almost unchanged and the mirror machinability does not decrease. Therefore, the heat treatment must be conducted under a condition where the average crystal grain size ($D_{50}$) of the sintered body lies in the above range. For this purpose, it is desired that the heat-treating time (time in which the sintered body is maintained at the heat-treating temperature) is from 1 to 15 hours and, particularly, from 3 to 10 hours. When the heat-treating time is shorter than one hour, the thermal conductivity is not improved to a sufficient degree. When the heat-treating time exceeds 15 hours, the crystal grains grow to decrease the strength.

The heat-treating temperature is maintained by the auxiliary heating of the molding die and the like after the pulse current has no longer been fed.

As described already, further, the thermal conductivity can be increased through the heat treatment particularly when the sintering aid is used in combination with the aluminum nitride powder. When the heat treatment is to be completed within a short period of time, it is desired to use the sintering aid.

FIG. 1 is a view schematically illustrating a basic structure of an apparatus preferably used for putting the method of the invention into practice.

Referring to FIG. 1, the apparatus is equipped with a molding die made of electrically conducting carbon and, further, with a pair of molding punches 2 made of electrically conducting carbon fitted into the molding die 1. An aluminum nitride powder 3 is charged into the molding die 1, a DC pulse current is fed through the molding punches 2 to elevate the temperature to a predetermined value (sintering temperature) while pressing the powder charged therein from the upper and lower sides by using the punches 2a and, after the sintering temperature is reached, the temperature is maintained for a predetermined period of time to mold a sintered body.

The pressure is exerted through the molding punches 2 and the pulse current is fed through the molding punches 2 by using control mechanisms that are not shown.

The above apparatus is installed in a chamber 4 and, as required, the interior of the chamber 4 is evacuated by using a vacuum pump 5. It is further allowable to conduct the sintering while replacing the interior of the chamber 4 by a gas such as nitrogen.

In charging the aluminum nitride powder into the molding die 1, it is desired to lay a carbon sheet (or film) on the inner surface of the molding die 1 and on the surfaces of the molding punches 2 that come in contact with the powder to prevent the sintering between the aluminum nitride powder and the above surfaces.

EXAMPLES

Described below are Examples for concretely illustrating the method of the present invention to which only, however, the invention is in no way limited.

In the following Examples and Comparative Examples, various physical properties were measured by the methods described below.

1) Measurement of Pore Density.

A cut surface of the sintered body was mirror polished. By using a scanning electron microscope (SEM), the mirror polished surface was observed at a magnification of 1000 times to count the number of pores (voids of diameters of not smaller than 1 µm). Not less than 500 visual fields of mirror polished surfaces were observed on a visual field of a magnification of 1000 times, and the number of pores of diameters of not smaller than 1 µm per a unit area was regarded to be a pore density.

2) Pore Area Ratio.

The areas of pores were calculated from the diameters of the pores counted in a manner as described above to find the total area of the detected pores. The ratio of the total area of the pores to the total visual field area that was observed (not less than 500 visual fields were observed at a magnification of 1000 times) was regarded to be a pore area ratio.

3) Measurement of a Bulk Density of the Aluminum Nitride Sintered Body.

Measured according to the Achemedes' method to calculate the relative density.

4) Aluminum Nitride Crystal Grain Size.

By using an image analyzing system (IP-1000PC, manufactured by Asahi Kasei Kogyo Co.), the crystal grain sizes were found from the photographs of microstructures of the sintered bodies by a method described below.

First, any cut surface to be evaluated was polished like a mirror surface and was treated at 1600 to 1650° C. at which the aluminum nitride crystal grains did not grow for one hour. Through this processing, the etching rate on the crystal grain boundaries becames greater than that of other portions. Therefore, the crystal grain boundaries only were etched, and there was obtained a surface on which the individual crystal grains of the aluminum nitride and of the grain boundary phase could be identified.

Next, the surface was observed by using the scanning electron microscope (SEM), a photograph of a microscructure was shot at such a magnification that 200 to 300 grains that were observed were contained in one visual field, and a plurality of pieces of photos were shot to cover 1000 to 2000 grains that were observed. The photographs of microstructures showed the aluminum nitride crystal particles in gray to black color and showed the grain boundary phase crystal grains in white color, enabling the grains to be easily identified.

Finally, by using an image analyzing system aided by a computer, diameters corresponding to circles of 1000 to 2000 aluminum nitride crystal grains were found from the images on the photographs of the microstructures. Further, diameters corresponding to circles of the grain boundary crystal grains were found from the photographs of the microstructures like those of the aluminum nitride crystal grains. The aluminum nitride crystal grains and the grain boundary phase crystal grains were nearly equiaxial and the grain sizes could be expressed by the diameters corresponding to the circles. In conducting the analysis, crystal grains that were cut at the ends of the analytical images were not included in the object for evaluation. Further, when two or more grain boundary phase crystal grains were contacting and when the length of the boundaries of the two crystal grains was greater than an average crystal grain size of the grains, the crystal grains in combination were treated as a single grain.

A 10% cumulative value ($D_{50}$), a 50% cumulative value ($D_{50}$) and a 90% cumulative value ($D_{90}$) were found based on a distribution curve of the measured crystal grain diameters, and a difference between $D_{90}$ and $D_{10}$ was calculated.

5) Measurement of Surface Roughness (JIS B0601).

A cut surface of the sintered body to be evaluated was mirror polished and was measured for its maximum surface roughness (Rmax) by using a surface roughness and shape measuring instrument (Surfcom 478A, manufactured by Tokyo Seimitsu Co.). The measuring conditions consisted of a cut-off of 0.8, a tracing speed of 0.06 mm/sec, a magnification of 50,000 times and a measuring length of 0.25 mm, and an average value of six measuring points was found.

6) Measurement of Thermal Conductivity.

Measured relying upon a laser flash method by using a thermal constant measuring apparatus PS-7 manufactured by Rigaku Denki Co. The thickness was corrected by using a calibration curve.

7) Measurement of Flexural Strength.

A three-point bending test was conducted at a crosshead speed of 0.5 mm/min. in compliance with the JIS R1601 but changing the span to 20 mm and the thickness of the test pieces to 2 mm. The test pieces possessed a width of 4 mm. The sintered body was cut into a width of 6 mm and both ends were cut by 1 mm to obtain a predetermined width. The upper and lower surfaces were cut.

8) Vickers' Hardness.

Measured by using a Vickers' hardness tester AVK-Co manufactured by Akashi Co. with a load of 5 kg and a loading time of 15 seconds at room temperature.

9) Average Crystal Grain Size of the Aluminum Nitride Powder.

Measured relying upon a laser diffraction method by using the MICROTRACK II (LEED & NORTHRUP Co.) by dispersing the aluminum nitride powder in water.

Example 1

Nylon balls of a diameter of 15 mm obtained by coating iron cores with a nylon (surface hardness of not larger than 100 kgf/mm$^2$, density of 3.5 g/cm$^3$) were introduced into a nylon pot of a volume of 2.4 liters. Into the nylon pot were further introduced 100 parts by weight of an aluminum nitride powder having an average crystal grain size of 1.3 μm, a specific surface area of 3.39 m$^2$/g and an oxygen concentration of 0.8% by weight, and 40 parts by weight of ethanol as a solvent, which were, then, wet-mixed together. The nylon balls were introduced in an amount of 40% of the volume (apparent volume) of the pot. The mixing was effected by rotating the pot at a speed of 70 rpm for 3 hours. The obtained slurry was dried to obtain an aluminum nitride powder.

Next, the aluminum nitride powder was sintered by using an apparatus having a basic structure shown in FIG. 1. A molding die 1 and molding punches 2 were made of graphite. In charging the aluminum nitride powder 3, the pushing surfaces of the molding punches were coated with a carbon sheet obtained by uniformly applying a boron nitride powder to prevent the adhesion between the molding punches and the powder.

The interior of the chamber 4 was evacuated (reduced pressure condition) by using a vacuum pump 5. By providing a control unit (not shown), further, the output of the power source for sintering was so controlled that the powder temperature detected by a temperature sensor (not shown) disposed on the molding die was in agreement with a temperature pattern that has been set in advance. Further, the press drive mechanism and the vacuum pump were driven being controlled by the control unit.

A pulse current was fed through the molding punches to elevate the temperature up to the sintering temperature while pressing the powder from the upper and lower sides by the molding punches by the action of the press drive mechanism. After the sintering temperature has been reached, the temperature was maintained for a predetermined period of time to mold a sintered body.

Most of the supplied electric current flew through the upper punch electrode→upper punch→molding die→lower punch→lower punch electrode to generate the Joule's heat which was used to heat the powder from the outer side. The rest of the electric current flew through the powder to generate a spark discharge in the gaps of the powdery grains. High energy of a discharge plasma generated by the spark discharge was effectively utilized for thermal diffusion/ electrolytic diffusion, and the powdery grains were presumably bonded together strongly.

The molding punches 2 worked to press from the upper and lower sides with a pressing force of 0.4 tf/cm², and a pulse voltage was applied (pulse condition was ON:OFF=12:2) to heat the molding die and the molding punch surfaces. The temperature was elevated in vacuum at a rate of 100° C./min and the sintering temperature (temperature that was reached) of 1600° C. was maintained for 5 minutes to effect the sintering to obtain a sintered body having a relative density of not smaller than 95%, a diameter of 30 mm and a thickness of 3 mm.

Table 1 shows the conditions for producing the aluminum nitride sintered body and Table 2 shows properties of the obtained aluminum nitride sintered body.

Example 2

The operation was conducted in the same manner as in Example 1 but selecting the sintering temperature (temperature that is reached) to be 1780° C.

Table 1 shows the conditions for producing the aluminum nitride sintered body and Table 2 shows properties of the obtained aluminum nitride sintered body.

Example 3

The operation was conducted in the same manner as in Example 1 but selecting the pressing pressure to be 0.35 tf/cm².

Table 1 shows the conditions for producing the aluminum nitride sintered body and Table 2 shows properties of the obtained aluminum nitride sintered body.

Example 4

The operation was conducted in the same manner as in Example 1 but selecting the pressing pressure to be 0.55 tf/cm².

Table 1 shows the conditions for producing the aluminum nitride sintered body and Table 2 shows properties of the obtained aluminum nitride sintered body.

Example 5

The operation was conducted in the same manner as in Example 1 but selecting the rate of elevating the temperature to be 30° C./min.

Table 1 shows the conditions for producing the aluminum nitride sintered body and Table 2 shows properties of the obtained aluminum nitride sintered body.

Example 6

The operation was conducted in the same manner as in Example 1 but selecting the rate of elevating the temperature to be 140° C./min.

Table 1 shows the conditions for producing the aluminum nitride sintered body and Table 2 shows properties of the obtained aluminum nitride sintered body.

Example 7

The operation was conducted in the same manner as in Example 1 but preparing a slurry by adding 5 parts by weight of an yttrium oxide powder having a purity of not lower than 99.99% and a specific surface area of 12.5 m²/g to 100 parts by weight of an aluminum nitride powder.

Table 1 shows the conditions for producing the aluminum nitride sintered body and Table 2 shows properties of the obtained aluminum nitride sintered body.

Example 8

A sintered body was obtained by conducting the operation in the same manner as in Example 7 but adding the sintering assistant in an amount of 3 parts by weight.

Table 1 shows the conditions for producing the aluminum nitride sintered body and Table 2 shows properties of the obtained aluminum nitride sintered body.

Example 9

A sintered body was obtained by conducting the operation in the same manner as in Example 7 but selecting the sintering temperature (temperature that is reached) to be 1780° C.

Table 1 shows the conditions for producing the aluminum nitride sintered body and Table 2 shows properties of the obtained aluminum nitride sintered body.

Example 10

A sintered body was obtained by conducting the operation in the same manner as in Example 7 but selecting the pressing pressure to be 0.35 tf/cm².

Table 1 shows the conditions for producing the aluminum nitride sintered body and Table 2 shows properties of the obtained aluminum nitride sintered body.

Example 11

A sintered body was obtained by conducting the operation in the same manner as in Example 7 but selecting the pressing pressure to be 0.55 tf/cm².

Table 1 shows the conditions for producing the aluminum nitride sintered body and Table 2 shows properties of the obtained aluminum nitride sintered body.

Example 12

A sintered body was obtained by conducting the operation in the same manner as in Example 7 but selecting the rate of elevating the temperature to be 30° C./min.

Table 1 shows the conditions for producing the aluminum nitride sintered body and Table 2 shows properties of the obtained aluminum nitride sintered body.

Example 13

A sintered body was obtained by conducting the operation in the same manner as in Example 7 but selecting the rate of elevating the temperature to be 140° C./min.

Table 1 shows the conditions for producing the aluminum nitride sintered body and Table 2 shows properties of the obtained aluminum nitride sintered body.

Example 14

The aluminum nitride sintered body obtained in Example 7 was heat-treated under the conditions of a temperature of 1750° C. for 2 hours.

The obtained aluminum nitride sintered body possessed nearly the same pore density and the pore area ratio but permitted the crystal grain size to increase and the heat conductivity to increase to 155 W/mK (properties of the obtained aluminum nitride sintered body are shown in Table 2).

Comparative Example 1

The operation was conducted in the same manner as in Example 1 but selecting the temperature that is reached (sintering temperature) to be 1400° C.

Table 1 shows the conditions for producing the aluminum nitride sintered body and Table 2 shows properties of the obtained aluminum nitride sintered body.

Comparative Example 2

The operation was conducted in the same manner as in Example 1 but selecting the temperature that is reached (sintering temperature) to be 1200° C.

Table 1 shows the conditions for producing the aluminum nitride sintered body and Table 2 shows properties of the obtained aluminum nitride sintered body.

Comparative Example 3

The operation was conducted in the same manner as in Example 7 but selecting the temperature that is reached (sintering temperature) to be 1400° C.

Table 1 shows the conditions for producing the aluminum nitride sintered body and Table 2 shows properties of the obtained aluminum nitride sintered body.

Comparative Example 4

The operation was conducted in the same manner as in Example 7 but selecting the temperature that is reached (sintering temperature) to be 1200° C.

Table 1 shows the conditions for producing the aluminum nitride sintered body and Table 2 shows properties of the obtained aluminum nitride sintered body.

Comparative Example 5

Nylon balls were introduced into a nylon pot of a volume of 10 liters. Into the nylon pot were further introduced 100 parts by weight of an aluminum nitride powder having an average crystal grain size of 1.5 μm, a specific surface area of 2.6 m²/g and an oxygen concentration of 0.8% by weight, 5 parts by weight of an yttrium oxide powder having a specific surface area of 12.5 m²/g as a sintering aid, 0.5 parts by weight of a hexaglycerin monooleate as a surfactant, 3 parts by weight of an n-butyl methacrylate and 100 parts by weight of toluene, which were, then, mixed together for 24 hours by using a ball mill to obtain a white slurry. The thus obtained slurry was granulated by a spray-drier method to obtain aluminum nitride granules of diameters of 70 to 100 μm.

The granules were press-molded under a molding pressure of 1.0 t/cm² to obtain a pressed body. Thereafter, the pressed body was dewaxed in the air at 600° C. for 5 hours, and was fired in a nitrogen atmosphere at 1800° C. in a boron nitride container for 5 hours to obtain a sintered body having a relative density of not lower than 95%.

Table 1 shows the conditions for producing the aluminum nitride sintered body and Table 2 shows properties of the obtained aluminum nitride sintered body.

Comparative Example 6

The operation was conducted in the same manner as in Comparative Example 5 but adding no sintering assistant. Table 1 shows the conditions for producing the aluminum nitride sintered body and Table 2 shows properties of the obtained aluminum nitride sintered body.

TABLE 1

|  | Sintering method | Amount of sintering aid (parts) | Firing temperature (° C.) | Firing time (min.) | Pressing pressure (tf/cm²) | Temperature elevating rate (° C./min) |
|---|---|---|---|---|---|---|
| Ex. 1 | SPS | 0 | 1600 | 5 | 0.4 | 100 |
| Ex. 2 | SPS | 0 | 1780 | 5 | 0.4 | 100 |
| Ex. 3 | SPS | 0 | 1600 | 5 | 0.35 | 100 |
| Ex. 4 | SPS | 0 | 1600 | 5 | 0.55 | 100 |
| Ex. 5 | SPS | 0 | 1600 | 5 | 0.4 | 30 |
| Ex. 6 | SPS | 0 | 1600 | 5 | 0.4 | 140 |
| Ex. 7 | SPS | 5 | 1600 | 5 | 0.4 | 100 |
| Ex. 8 | SPS | 3 | 1600 | 5 | 0.4 | 100 |
| Ex. 9 | SPS | 5 | 1780 | 5 | 0.4 | 100 |
| Ex. 10 | SPS | 5 | 1600 | 5 | 0.35 | 100 |
| Ex. 11 | SPS | 5 | 1600 | 5 | 0.55 | 100 |
| Ex. 12 | SPS | 5 | 1600 | 5 | 0.4 | 30 |
| Ex. 13 | SPS | 5 | 1600 | 5 | 0.4 | 140 |
| Comp. Ex. 1 | SPS | 0 | 1400 | 5 | 0.4 | 100 |
| Comp. Ex. 2 | SPS | 0 | 1200 | 5 | 0.4 | 100 |
| Comp. Ex. 3 | SPS | 5 | 1400 | 5 | 0.4 | 100 |
| Comp. Ex. 4 | SPS | 5 | 1200 | 5 | 0.4 | 100 |
| Comp. Ex. 5 | heat-sintering | 5 | 1800 | 300 | — | 10 |
| Comp. Ex. 6 | heat-sintering | 0 | 1800 | 300 | — | 10 |

Note)
SPS: Discharge plasma sintering
Firing temperature = Temperature reached

TABLE 2

|  | Relative density (%) | Pore density (pores/mm²) | Pore area ratio ×10⁻⁷ | Average grain size $D_{50}$ (μm) | Grain size distribution ($D_{90}$–$D_{10}$) (μm) | Surface roughness($R_{max}$) (μm) | Flexural strength (MPa) | Thermal conductivity (W/mk) | Hardness (GPa) |
|---|---|---|---|---|---|---|---|---|---|
| Ex. 1 | 100.0 | 0.010 | 0.10 | 0.75 | 0.71 | 0.033 | 375 | 57 | 16.2 |
| Ex. 2 | 100.0 | 0.039 | 0.40 | 1.85 | 1.43 | 0.040 | 360 | 65 | 15.4 |
| Ex. 3 | 100.0 | 0.016 | 0.15 | 0.75 | 0.72 | 0.035 | 350 | 58 | 15.6 |
| Ex. 4 | 100.0 | 0.010 | 0.12 | 0.95 | 0.95 | 0.032 | 370 | 65 | 16.7 |
| Ex. 5 | 99.8 | 0.031 | 0.29 | 1.50 | 1.42 | 0.031 | 371 | 69 | 15.5 |
| Ex. 6 | 99.7 | 0.015 | 0.13 | 0.80 | 0.85 | 0.032 | 360 | 58 | 16.5 |
| Ex. 7 | 99.3 | 0.009 | 0.40 | 1.02 | 1.03 | 0.036 | 543 | 110 | 14.5 |
| Ex. 8 | 99.5 | 0.015 | 0.20 | 0.99 | 1.00 | 0.035 | 520 | 130 | 15.3 |
| Ex. 9 | 100.0 | 0.015 | 0.15 | 1.50 | 1.05 | 0.038 | 520 | 130 | 14.1 |
| Ex. 10 | 99.9 | 0.014 | 0.10 | 1.05 | 1.00 | 0.035 | 520 | 110 | 14.3 |
| Ex. 11 | 99.9 | 0.009 | 0.10 | 0.90 | 0.70 | 0.030 | 540 | 120 | 15.1 |
| Ex. 12 | 100.0 | 0.010 | 0.10 | 1.55 | 1.00 | 0.035 | 520 | 135 | 14.2 |
| Ex. 13 | 99.6 | 0.015 | 0.15 | 0.90 | 0.75 | 0.030 | 530 | 115 | 14.8 |
| Ex. 14 | 100.0 | 0.010 | 0.38 | 1.10 | 1.08 | 0.039 | 535 | 155 | 14.3 |
| Comp. Ex. 1 | 94.1 | 0.330 | 106.6 | 0.70 | 0.71 | 0.050 | 250 | 45 | 9.8 |
| Comp. Ex. 2 | 79.9 | — | — | — | — | — | 200 | 20 | — |
| Comp. Ex. 3 | 93.5 | 0.380 | 150.5 | 0.73 | 0.78 | 0.080 | 230 | 40 | 9.5 |
| Comp. Ex. 4 | 75.0 | — | — | — | — | — | 180 | 15 | — |
| Comp. Ex. 5 | 99.3 | 0.100 | 5.20 | 2.79 | 3.50 | 0.123 | 391 | 176 | 12.0 |
| Comp. Ex. 6 | 99.6 | 0.960 | 99.90 | 5.54 | 7.82 | 0.068 | 336 | 87 | 11.5 |

Note)
The sintered body of Example 14 was obtained by heat-treating the sintered body of Example 7.

The aluminum nitride sintered body of the present invention contains pores in very small amounts and has a high hardness and is, hence, useful as a substrate material for forming a highly precise pattern by mirror polishing the surface. For example, the sintered body is mirror polished to obtain a substrate for circuit having a very smooth mirror surface of a surface roughness Rmax of smaller than 0.040 μm. Owing to its a high hardness and a high thermal conductivity, further, the aluminum nitride sintered body can be used as a slide member which is capable of efficiently radiating the heat of friction.

The invention claimed is:

1. An aluminum nitride sintered body comprising crystal grains of an average grain size ($D_{50}$) of 0.1 to 2.3 μm, and having a pore area ratio of not larger than 1×10⁻⁷, a pore density of not larger than 0.05 pores/mm² of pores having diameters of not smaller than 1 μm, and a Vickers' hardness in a range of 14 to 17 GPa, wherein said crystal grains have such a grain size distribution that a difference between the cumulative 90% grain size ($D_{90}$) and the cumulative 10% grain size ($D_{10}$) is not larger than 1.5 μm.

2. A substrate obtained by mirror polishing the aluminum nitride sintered body of claim 1.

3. An aluminum nitride sintered body obtained by sintering an aluminum nitride powder using a pulse current method, said aluminum nitride sintered body comprising crystal grains which have an average grain size (D50) of 0.1 to 2.5 μm, and such a grain size distribution that a difference between the cumulative 90% grain size ($D_{90}$) and the cumulative 10% grain size ($D_{10}$) is not larger than 1.5 μm, and having:

a pore area ratio of not larger than 1×10⁻⁷, a pore density of not larger than 0.05 pores/mm² of pores having diameters of not smaller than 1 μm, and a Vickers' hardness in a range of 14 to 17 GPa.

* * * * *